(12) United States Patent
Haba

(10) Patent No.: US 6,572,781 B2
(45) Date of Patent: Jun. 3, 2003

(54) MICROELECTRONIC PACKAGING METHODS AND COMPONENTS

(75) Inventor: Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/858,770

(22) Filed: May 16, 2001

(65) Prior Publication Data

US 2002/0074081 A1 Jun. 20, 2002

Related U.S. Application Data

(60) Provisional application No. 60/204,735, filed on May 16, 2000.

(51) Int. Cl.⁷ ................................................. B44C 1/22
(52) U.S. Cl. .............................. 216/33; 216/20; 216/36; 257/774; 438/689
(58) Field of Search ............................. 216/13, 20, 33, 216/36, 100, 105, 102; 438/117, 118, 611, 689; 257/674, 773, 774; 174/255, 260, 262

(56) References Cited

U.S. PATENT DOCUMENTS

| | | | |
|---|---|---|---|
| 5,518,964 A | 5/1996 | DiStefano et al. | 437/209 |
| 5,688,716 A | 11/1997 | DiStefano et al. | 437/182 |
| 5,798,286 A | 8/1998 | Faraci et al. | 438/113 |
| 5,830,782 A | 11/1998 | Smith et al. | 438/123 |
| 5,913,109 A | 6/1999 | DiStefano et al. | 438/117 |
| 6,117,694 A | 9/2000 | Smith et al. | 438/14 |
| 6,228,686 B1 | 5/2001 | Smith et al. | 438/117 |

Primary Examiner—William A. Powell
(74) Attorney, Agent, or Firm—Lerner, David, Littenberg, Krumholz & Mentlik, LLP

(57) ABSTRACT

A sheet including lead regions with conductors and a main region surrounding the lead regions is formed on the front surface of a microelectronic element such as a wafer, or assembled thereto, so that the conductors are connected to contacts on the microelectronic element. After the sheet is in place, the sheet is eroded to form gaps partially bounding the lead regions, leaving tip ends of the lead regions moveable with respect to the main region. The tip ends of the lead regions, or the main region, is lifted away from the microelectronic element, thus bending the tip ends away from the main region. Because the gaps are not formed until after the conductors are connected to the contacts, the connecting step is simplified.

39 Claims, 5 Drawing Sheets

MICROELECTRONIC PACKAGING METHODS AND COMPONENTS

CROSS-REFERENCE TO RELATED APPLICATIONS

The present application claims the benefit of U.S. Provisional Application No. 60/204,735 filed May 16, 2000, the disclosure of which is incorporated herein.

BACKGROUND OF THE INVENTION

The present invention relates to microelectronic packaging and more particularly relates to connection components and methods for packaging microelectronic elements such as semiconductor chips, wafers, and other elements.

As illustrated in certain preferred embodiments of U.S. Pat. No. 5,518,964 ("the '964 patent") movable interconnections between a microelectronic elements such as a semiconductor chip or wafer and another element can be provided by providing a connection component incorporating a dielectric body and leads extending on the bottom surface of the dielectric body. The leads may have first or fixed ends permanently attached to the dielectric body and connected to electrically conducted features such as terminals, traces or the like on the dielectric body. The leads also may have second or tip ends releasably attached to the dielectric body. The dielectric body, with the leads thereon, may be juxtaposed with the microelectronic element and the second or tip ends of the leads may be bonded to contacts on the microelectronic element. After bonding, the dielectric body and the microelectronic element are moved away from one another, thereby deforming the leads to a vertically extensive disposition. A curable liquid material may be introduced between the dielectric body and the microelectronic element during or after the moving step and cured to form a compliant dielectric layer as, for example, an elastomer or a gel surrounding the leads.

The resulting packaged microelectronic element has terminals on the dielectric body of the connection component which are electrically connected to the contacts on the chip but which can move relative to microelectronic element so as to compensate for thermal effects. For example, a semiconductor chip packaged in this manner may be mounted to a circuit board by solder-bonding the terminals to conductive features of the circuit board. Relative movement between the circuit board and the chip due to thermal effects is taken up in the movable interconnection provided by the leads and the compliant layer. Many variations of these processes and structures are disclosed in the '964 patent and the entire disclosure of such patent is incorporated herein by reference. Merely by way of example, the package-forming process can be conducted on a wafer level, so that numerous semiconductor chips in unitary wafer are connected to connection components in one operation or in one sequence of operations.

Additional variations and improvements of the process taught in the '964 patent are disclosed in commonly assigned U.S. Pat. Nos. 5,578,286; 5,830,782; 5,688,716; and 5,913,109 and in co-pending, commonly assigned U.S. patent application Ser. No. 09/271,688, filed Mar. 18, 1999. The disclosures of all of the aforesaid patents and applications are hereby incorporated by reference herein.

As described in certain preferred embodiments of the co-pending, commonly assigned U.S. Pat. No. 6,117,694; U.S. patent application and Ser. No. 09/317,675, filed May 24, 1999, and U.S. Pat. No. 6,228,686, the disclosures of which are also incorporated by reference herein, a connection component may be provided as a sheet of a dielectric material with a main region and with lead regions defined by slots extending through the sheet. Such slots extend partially around each such lead region. For example, where the lead regions are elongated strips, the slots may be formed as an elongated "U" with the base of the "U" disposed at a tip end of the lead and with the open end of the "U" disposed at a fixed end of the lead region. Thus, the lead region remains connected to the main region at the fixed end or open end of the U-shaped slot. Typically, the sheet is positioned on a temporary support before the slots are formed. Each lead region includes one or more electrically conductive strips connected to terminals exposed at a top surface of the main region. After the slots have been formed, the support, with the component therein, is engaged with a microelectronic element such as a chip or wafer so that bottom surface of the sheet faces toward the microelectronic element. The tip ends of the lead regions are bonded to contacts on the chip so as to electrically connect the contacts of the chip to the strips in the lead regions. After bonding, the support, with the main region of the sheet therein, is moved away from the microelectronic element so as to bend the lead regions out of the plane of the sheet and form vertical extensive leads. The support is removed leaving the terminals exposed for connection to another component. A curable liquid may be introduced between the main region of the sheet and the microelectronic element during or after the movement process.

Despite these improvements in the art, still further improvements and variations would be desirable.

SUMMARY OF THE INVENTION

One aspect of the invention provides methods of making a microelectronic assembly. A method according to this aspect of the invention desirably includes the steps of providing a sheet overlying a first element as, for example, an active microelectronic element such as a semiconductor chip or wafer. The sheet has lead regions each having a tip end and a fixed end remote from its tip end. The sheet also has a main region surrounding said tip regions. The lead regions of the sheet include conductive material extending between said tip ends and said fixed ends.

The method desirably further includes connecting the tip ends or the fixed ends of said lead regions to the first element. Then, after the tip ends or the fixed ends have been connected, portions of the sheet adjacent the lead regions are removed so as to leave a plurality of gaps in the sheet partially surrounding each lead region. The gaps are formed so that the fixed ends of the lead regions remain connected to the main region but the tip ends can be displaced relative to the main region.

Where the connecting step is performed so as to connect the tip ends of the lead regions to said first element, the method desirably further includes the step of moving the main region of the sheet and the first element away from one another through a predetermined displacement. In this step, the motion of the main region relative to the first element includes a component of motion in an upward direction, transverse to the plane of the sheet and away from the first element. Thus, the motion of the main region causes bending of the lead regions downwardly from the main region of said sheet. This action forms the lead regions into leads projecting from the main region of said sheet downwardly toward the chip.

Where the connecting step is performed so as to connect the fixed ends of the lead regions to the first element, the method desirably includes the step of moving the tip ends of the leads and the first element away from one another through a predetermined displacement so as to bend the lead regions upwardly from the main region of said sheet and form leads projecting from said main region of the sheet.

Methods according to this aspect of the invention can provide benefits and features similar to those achieved in certain embodiments of the aforementioned U.S. Pat. No. 6,228,686. However, because the gaps in the sheet are not formed until after the sheet is in place on the first element, the positions of the lead ends can be controlled precisely during the process. This facilitates the process of connecting the lead ends to the terminals. Also, there is no need for a temporary support to hold the lead regions in place between the time the gaps are formed and the time the ends of the lead regions are connected to the first element.

In particularly preferred embodiments, the step of providing the sheet includes at least partially forming the sheet in place on said first element. The sheet desirably includes a dielectric layer and a metallic layer, the metallic layer being disposed above the dielectric layer so that the dielectric layer is disposed between the metallic layer and the first element. The metallic layer desirably covers regions of the sheet outside of the lead regions. The metallic layer also may include metallic strips extending within the lead regions. These strips may form the conductive elements of the lead regions. The step of removing portions of the sheet may include eroding portions of the dielectric layer not covered by the metallic layer. In this operation, the metallic layer desirably acts as a mask to protect portions of the sheet during said eroding step. For example, the metallic layer may include slots surrounding the lead regions, and the dielectric layer may be performed by exposing the dielectric layer to an etchant and/or to radiant energy through the slots.

A method of making a microelectronic assembly according to a further aspect of the invention includes providing a sheet with lead-forming regions, each having a tip end and a fixed end remote from its tip end. Here again, the sheet has a main region surrounding the lead regions. The sheet has a plurality of gaps partially surrounding each lead region so that the fixed end of each lead-forming region is attached to the main region. The lead-forming regions include conductive material extending between the tip ends and the fixed ends.

The method according to this aspect of the invention desirably includes adhesively securing the sheet on a surface of a first element and connecting the fixed ends or the tip ends of the lead-forming regions to the first element. The method according to this aspect also includes providing interruptions in the adhesive bond between the sheet and the first element at the lead-forming regions so as to at least partially free at least the lead-forming regions for movement relative to the first element. For example, the interruptions in the adhesive bond may be formed during an erosion processes as discussed above.

Yet another aspect of the invention provides a method of making a microelectronic assembly. The method according to this aspect of the invention desirably includes juxtaposing a first microelectronic element with a dielectric sheet having a main portion with top and bottom surfaces and having metallic terminal structures extending through the sheet, the metallic terminal structures have top ends exposed at said top surface of said sheet and bottom ends exposed at said bottom surface of said sheet. The element and sheet are juxtaposed with one another so that the bottom surface of the sheet faces toward the first microelectronic element and so that the bottom ends of the terminal structures are aligned with contacts on the first microelectronic element.

The method according to this aspect of the invention desirably further includes bonding the bottom ends of the terminal structures to contacts on the first microelectronic element. The bonding operation includes applying downward forces to the top ends of the terminal structures so as to forcibly engage such bottom ends with the contacts on the first microelectronic element.

After the bonding operation, lead-forming elements of the sheet electrically connected to said terminal structures may be deformed so as to bend tip ends of such lead forming elements away from said first microelectronic element and away from said main portion of said sheet.

In methods according to this aspect of the invention, the terminal structures desirably serve to transmit the bonding forces through the sheet. This facilitates certain types of bonding as, for example, ultrasonic bonding.

Still further aspects of the present invention provide components for making microelectronic assemblies. Components according to this aspect of the invention may include features such as the dielectric sheet and terminal structures discussed above.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 2:
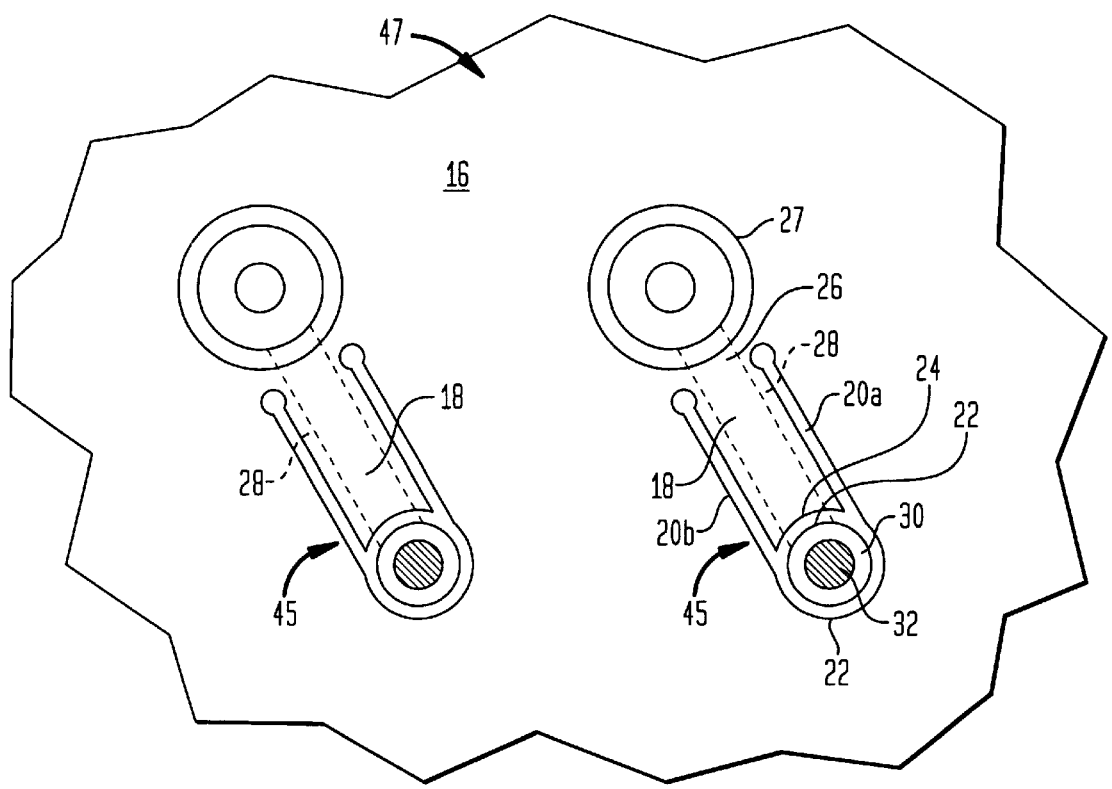
FIG. 2 is a diagrammatic plan view of the component depicted in FIG. 1.

One embodiment of the present invention provides a process of making a microelectronic assembly. The process utilizes a sheet 10 incorporating a dielectric layer 12 having a metallic covering layer 14 on a top surface of the dielectric layer. Dielectric layer 12 may be a conventional sheet-like dielectric film as, for example a polyimide or other polymer film. Typically, the film is on the order of 25–75 microns thick. The metallic covering layer incorporates a main portion 16 overlying the main region of the sheet and metallic strips 18 separated from the main portion by slots 20 extending through the metallic layer. As best appreciated with reference to FIG. 2, slots 20 include slots 20a and 20b extending generally parallel to one another in the lengthwise direction along opposite sides of each strip 18 and merge with an open area 22 adjacent a tip end 24 of each strip. However the slots do not completely isolate the strips. Thus, each strip 18 is continuous with the main portion 16 at a fixed end 26 of the strip. The metallic covering layer also has holes 27 disposed adjacent the fixed end 26 of the strips. The metallic covering layer may be, for example, a copper layer.

Figure 1:
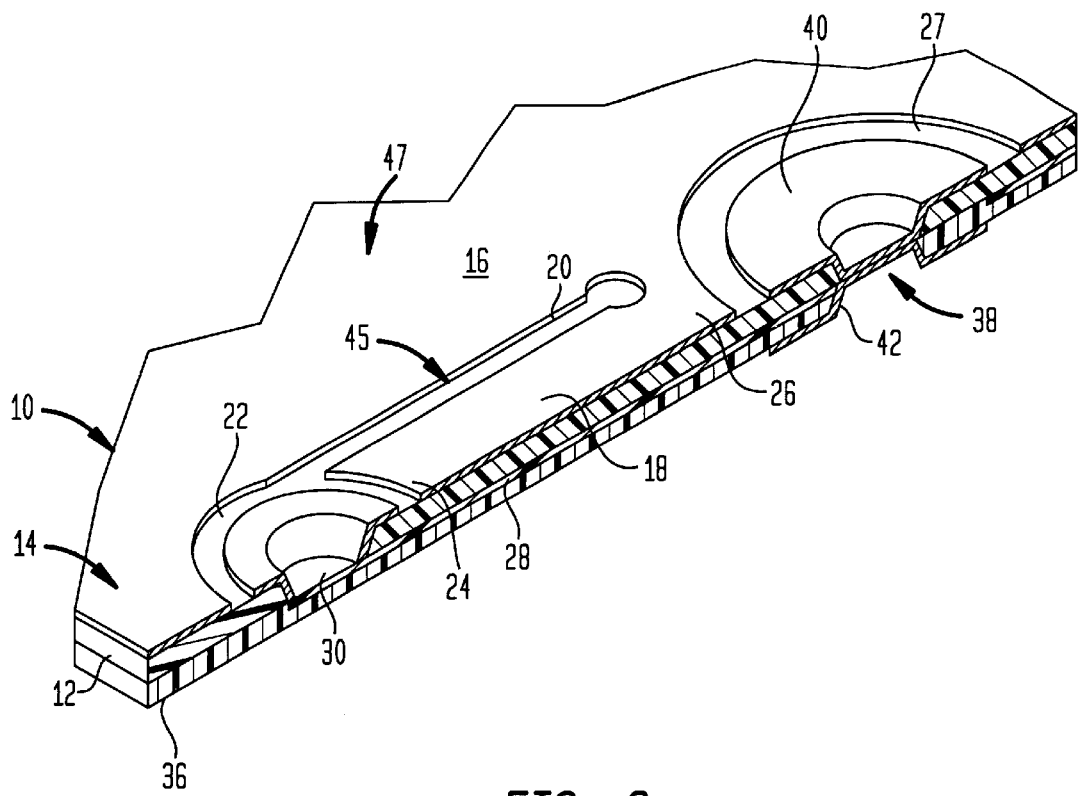
FIG. 1 is a fragmentary, diagrammatic, partially sectional view of a component in accordance with one embodiment of the invention.

Conductors 28 are provided on the bottom surface of dielectric layer 12, i.e., the surface facing downwardly in FIG. 1. These conductors extend beneath strips 18. A metallic via or tip end terminal structure 30 extends upwardly though the dielectric layer 12 and is exposed in open area 22 at the tip end of each conductor 28. Vias 30 are electrically continuous with conductors 28. Vias 30 may carry masses of electrically conductive bonding materials such as solder. These masses are omitted in FIG. 1 for clarity of illustration.

The sheet also includes an adhesive layer 36 carried on the bottom surface of the sheet and covering conductors 28. The adhesive layer may be a heat-activatable adhesive such a "snap cure" adhesive, a pressure sensitive adhesive, or any other adhesive compatible with other elements of the system. Desirably, the adhesive layer has a different composition than dielectric layer 12 although adhesive layers having the same composition as the dielectric layer may be employed.

Metallic fixed end terminal structures 38 are provided at the fixed ends of conductors 28, i.e., the ends adjacent to fixed ends 26 of the strips. Each metallic terminal structure incorporates a first metallic via liner 40 projecting upwardly through the dielectric layer 12 and a second metallic via liner 42 projecting downwardly from conductor 28 through the adhesive layer 36. Each of the fixed end terminal structures 38 is aligned with one of the holes 27 in the main region 16 of metallic covering layer 14.

The features discussed above thus define lead regions 45 of the sheet including strips 18, conductors 28 and tip end terminal structures or vias 30, and also including those portions of the dielectric layer 12 and adhesive layer 36 aligned with these features, and further define a main region 47 of the sheet including main portion 16 of the metallic covering layer and the underlying portions of the dielectric and adhesive layers. Fixed end terminal structures 38 are disposed in the main region of the sheet. At this stage of the process, the adhesive layer 36 and dielectric layer 12 are not interrupted at the borders of the lead regions.

The conductors 28, tip end terminal structures 30 and fixed end terminal structures 38 are electrically isolated from the metallic covering layer 14. In use of the finished product, the metallic covering layer 14 typically serves as a potential plane such as a ground plane or a power plane. One or more of the conductors 28 which is to serve as a ground or power conductor may be made electrically continuous with the metallic covering layer, as by merging the top of the liner 40 of the associated fixed end terminal structure 38 with the main portion 16 of the covering layer. Sheet 10 can be fabricated using conventional procedures such as lamination, photochemical etching, plating and other deposition techniques.

In a bonding process according to one embodiment of the invention, sheet 10 is juxtaposed with a first microelectronic element such as semiconductor chip or wafer 50 having contacts 54 on a front surface 52. Any other type of microelectronic element having electrically conductive structures may be used instead of a chip or wafer. For example, the first microelectronic element 50 may be circuit panel such as a flexible or rigid printed circuit board or a connection component adapted to make connection with other electronic elements. Prior to engagement of the sheet with the microelectronic element, a protective covering layer 56 such as a layer of copper, aluminum or other metal is deposited on the front surface 52 except in the areas immediately adjacent contacts 54. This procedure may be performed during manufacture of the microelectronic element. Gaps 58 between the protective covering layer 56 and contacts 54 maintain the contacts electrically isolated from the protective layer 56. Protective covering layer 56 typically overlies a passivation layer (not shown) incorporated in the microelectronic element. The chemical composition of the protective covering layer 56 and the passivation layer are selected so that the protective covering layer does not cause undesirable interactions with the electronic devices included in the microelectronic element.

Sheet 10 is engaged with microelectronic element 50 so that the bottom surface of the sheet and hence adhesive layer 36 faces downwardly toward the microelectronic element. The dielectric 12 overlies the adhesive layer and the metallic covering layer 14 of the sheet faces upwardly, away from the microelectronic element. When the sheet is engaged with the microelectronic element, the fixed end terminal structures 38 are aligned with the contacts 54 of the microelectronic element. Such alignment may be achieved, for example, by conventional machine-vision systems. Desirably, the sheet is held taut in a rigid frame during fabrication and during alignment so as to achieve precise control of the locations of the elements on the sheet. Processing and alignment of sheets on frames is disclosed in co-pending, commonly assigned U.S. patent applications Ser. Nos. 09/173,797 and 09/174,074, the disclosures of which are hereby incorporated by reference herein.

Figure 3:
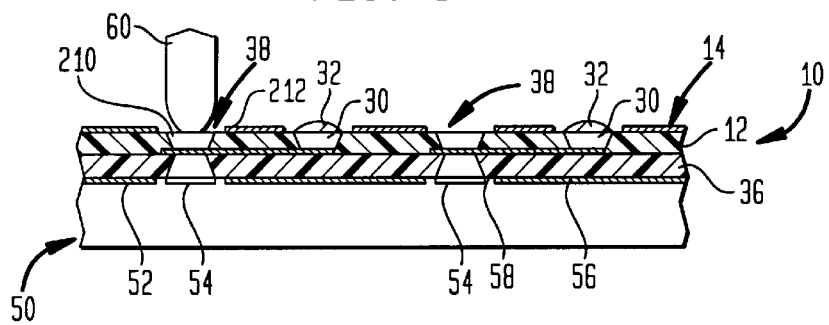
FIGS. 3 and 4 are fragmentary, diagrammatic, sectional views of the component depicted in FIG. 1 during successive stages of a process according to one embodiment of the invention.

Adhesive layer 36 bonds the sheet to the metallic protective layer 56 and hence to microelectronic element 50 and holds the sheet in place. Depending upon the nature of adhesive layer 36, heat, pressure or both may be applied to activate the adhesive and form the adhesive bond. The fixed end terminal structures 38 are bonded and electrically connected to the contacts 54 of the microelectronic element. Desirably, this bonding occurs after the sheet is held in place by the adhesive, although bonding of the terminals structures may be performed simultaneously with, before or after bonding of the sheet. Bonding of the terminal structures may be performed by engaging the top of the liner 40 of each terminal structure with a bonding tool 60 (FIG. 3) and forcing the terminal structure downwardly into engagement with the aligned contact 54 on the microelectronic element. Processes such as sonic, ultrasonic, or thermosonic bonding may be used. Because each metallic terminal structure 38 provides a continuous metallic structure exposed at both of the top and bottom surfaces of sheet 20, the forces applied by the bonding tool 60 are transmitted efficiently though the terminal structure to assure firm engagement between the bottom of the structures 42 and contacts 54. Although the tool 60 is depicted as engaging only a single terminal structure 38, the tool may engage multiple terminal structures simultaneously. Other methods of bonding may be employed. For example, a metallurgical bond such as a eutectic or solder bond may be formed between the fixed end terminals structures and the contacts, or an electrically conductive adhesive may be employed.

Figure 5:
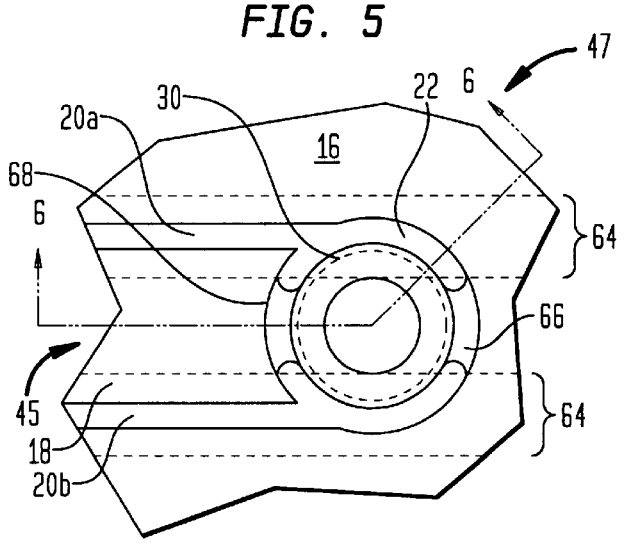
FIG. 5 is a fragmentary, diagrammatic top plan view of the component depicted in FIGS. 1–4 at a stage during the method of FIGS. 3–4.
Figure 6:
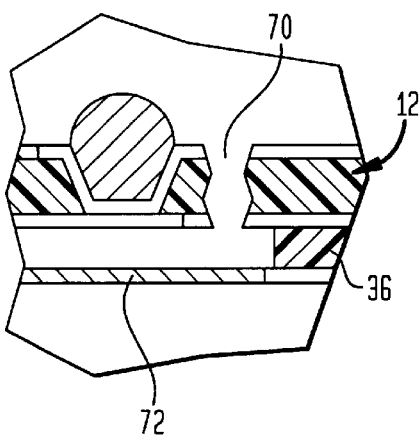
FIG. 6 is fragmentary, sectional view of the components depicted in FIGS. 1–5 during a later stage in the process.

Before or, preferably, after bonding the terminal structures 38, the dielectric sheet 12 is eroded by applying radiant energy such as a laser beam 62 to the top surface of the sheet. The laser beam 62 impinges on the top surface of dielectric sheet 12 through openings in the metallic covering layer 14. As seen in detail on an enlarged scale in FIG. 5, the beam may be swept along zones 64 encompassing slots 20*a* and 20*b* on the edges of each strip and also encompassing at least a part of each tip end opening 22. The beam desirably is not swept over the holes 27 at the fixed ends of the lead regions. The laser ablation erodes the dielectric layer within slots 20*a* and 20*b* and within tip end openings 22 to form gaps 70 in the dielectric layer, seen in sectional view in FIG. 6. Some of the laser radiation may penetrate through adhesive layer 36. This radiation is effectively blocked by the metal protective layer 56 on the microelectronic 50 and does not damage the electronic devices within the microelectronic element. The ablation procedure leaves a strip of dielectric material between the top surface metal strip 18 and the conductor 28 of each led region. This strip of dielectric material is continuous with the main portion of the dielectric layer at the fixed end 26 of the lead region. Desirably, a small portion 68 of the dielectric layer extends between that portion of the dielectric layer beneath each strip 18 and the portion of the dielectric layer left intact beneath each tip end terminal structure 30. Also, a small bridge 66 of dielectric material may remain and temporarily connect the tip end of each lead region 45 with the dielectric layer in main portion 47 of the sheet. During the laser ablation process, the metallic covering layer 14, including the strips 18 and the main region 16 as well as the tip end terminals 30 act as masks to limit the erosion process.

Figure 4:
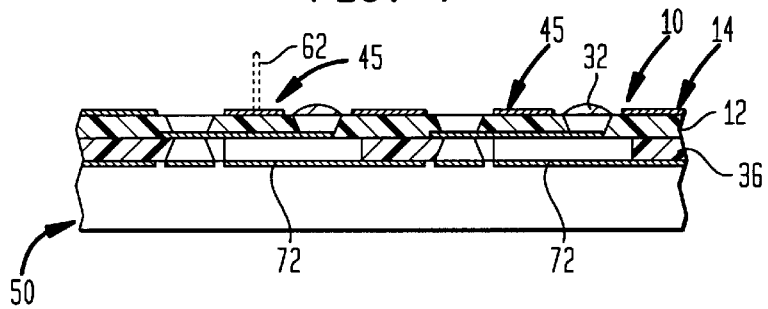

At this stage of the process, the adhesive bond is intact between the lead regions 45 of sheet 10 and the microelectronic element 50. The assembly is then exposed to an etchant such as a liquid, gas, or preferably, a plasma such as a fluorine-containing plasma. The etchant penetrates into the gaps 70 formed by laser ablation and degrades the adhesive bonds by eroding the adhesive layer 12. The erosion of the adhesion layer begins at the gaps 70 formed by laser ablation and hence begins at slots 20*a* and 20*b* in the top covering layer and at the tip end openings 22. This erosion proceeds relatively rapidly. The etchant may attack the dielectric layer 12 but desirably the rate of attack of the etchant in the dielectric layer is substantially less than the rate of attack in the adhesive layer. Thus, openings 72 (FIGS. 4 and 6) are formed in the adhesive layer in alignment with lead regions 45. It is not essential that all of the adhesive be removed from beneath each lead region. Rather, it is desirable that the adhesive be sufficiently degraded beneath the lead regions to reduce the strength of the adhesive bond between the lead regions and the microelectronic element. For example, a very thin ridge of adhesive may remain adjacent the centerline of each lead region 45. Because such a thin ridge of adhesive has a small surface area in contact with the lead region, the bond between the lead region and the microelectronic element can be released readily. The degradation process may also involve exposure to a chemical agent which releases the bond between the adhesive and the lead region, between the adhesive and the microelectronic element or both without physically removing the adhesive in these portions of the assembly.

Figure 7:
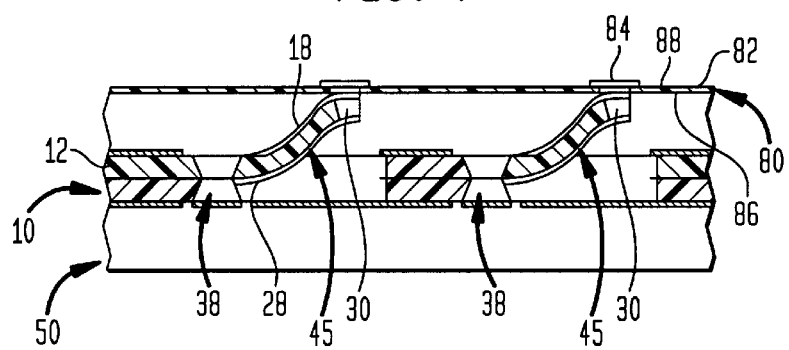
FIG. 7 is a fragmentary, sectional view of the components depicted in FIGS. 1–6 during a still later stage of the process.

After the adhesive bond has been degraded, the subassembly including the first microelectronic element 50 and sheet 10 is juxtaposed with a second microelectronic element 80. In FIG. 7, the second microelectronic element is depicted as a simple connection component incorporating a dielectric sheet 82 and terminal structures 84 exposed at the bottom surface 86 of the dielectric sheet and at the top surface 88 of the sheet. Other microelectronic elements may be employed as, for example, chips, wafers, circuit panels and more complex connection components incorporating complex conductive structures such as patterns of leads traces and the like. Conductive features of the second microelectronic element 80 are aligned with the tip ends of the lead regions 45 and hence aligned with the tip end terminal structures 30. The bonding material 32 carried on the tip end terminal structures is activated so as to bond the tip end terminal structures to the conductive features of the second microelectronic element. The first and second microelectronic elements are then moved away from one another so as to bend the lead regions 45 upwardly away from the main portion of the sheet 12 and form the lead regions into vertically extensive leads as depicted in FIG. 7. Each of the vertically extensive leads includes a conductor 28; a strip-like portion of dielectric layer 12 overlying the conductor 28, and a metallic strip 18 separated from the conductor 28 by the strip-like portion of dielectric layer 12.

During this procedure, the tip ends are moved upwardly through a pre-selected displacement. Also, during this procedure, the bridges 66 at the tip ends of the lead regions are broken. The main portion 47 of sheet 10 remains in place on the front surface of the first microelectronic element. During or after movement of the microelectronic elements, a flowable composition is injected between the microelectronic elements so as to form a dielectric layer surrounding the lead regions. Certain compositions, such as gel precursors or elastomer precursors may require curing, as by chemical reaction, to form the desired dielectric layer. The composition may be injected under pressure so that the pressure of the composition helps to impel the dielectric elements away from one another. The resulting assembly has a flexible lead structure and compliant layer which mechanically decouple the microelectronic elements from one another and allow relative movement there between. Such relative movement can compensate for differential thermal expansion.

The resulting assembly can be used as is or subjected to further processing. For example, one or both of the microelectronic elements can be severed to form smaller units. Thus, where one or both of the microelectronic elements is a wafer incorporating multiple semiconductor chips, such severing operations can be conducted so as to form individual units each including one or a few semiconductor chips.

In the finished assembly, leads 45 provide a multi-conductor lead. For example, the conductor 28 and tip end terminal structure 30 of a lead may carry a signal potential whereas the strip 18 of the same lead may carry a power or ground potential so as to provide a reference potential. In a further embodiment, the strips 18 can be provided with separate tip end terminal structures (not shown) adjacent the tip ends of the lead regions so that the strips, as well as the conductors 28 are connected to contacts on the second microelectronic element. Strips 18 need not be continuous with the main region 16 of the metallic top layer 14. Some or all of the strips may be provided with separate fixed end terminal structures which may be electrically isolated from the main region of the metallic layer 14 and which are bonded to additional contacts on the first microelectronic element. Such a structure thus provides a two-conductor lead. As described in greater detail in commonly assigned International Publications WO 97/11588 and WO 98/44564, the disclosures of which are hereby incorporated by reference herein, the conductors of a dual conductor lead may be used either to carry a fixed potential and a signal or to carry two signal potentials, such as two opposite-polarity signals. As also described in these publications, a multiconductor lead may include three or more conductors. Leads with three or more conductors may be formed by providing additional conductors in the lead regions of the sheet, with appropriate terminal structures.

The process described above provides significant benefits. Sheet 10 can be handled and laminated to the first microelectronic element 50 as a continuous, unitary sheet. There is no need for a separate temporary support element extending over the sheet to maintain the tip ends of the leads in position during assembly. Because the openings in the dielectric layer are not formed until after the sheet has been joined to the first microelectronic element, any distortion of the sheet which might be caused by formation of the openings in the dielectric layer will not cause displacement of the fixed end terminal structures. This simplifies alignment and assembly. Use of the fixed end terminal structures to transmit forces from the tool at the top of the sheet through the sheet provides good bonding between the fixed end terminal structures and the contacts on a first microelectronic element.

In a process according to a further embodiment of the invention, adhesive layer 36 can be formed with openings 72 when the sheet is fabricated so that these openings are aligned with the lead regions of the sheet. In this procedure, it is not necessary to degrade the adhesive bond after joining the sheet to the microelectronic element. In a further variant, a chemical etchant rather than laser ablation is employed to form the openings 70 in the dielectric layer. Here again, the metallic top covering layer, including the main regions 16 and strips 18, acts as a mask. Additional masking may be provided at the fixed end of openings 27 (FIG. 1) and on portions of tip end openings 22 to limit attack of the etchant in these regions of the dielectric sheet. The same etchant which attacks the dielectric sheet may also serve to degrade the adhesive bond beneath the lead regions. Where laser ablation is not employed to form the gaps in the dielectric layer, the microelectronic element need not be provided with a protective layer 56. Also, the protective layer can be omitted if the laser ablation is controlled so that it does not damage the microelectronic element. For example, the optical system employed with the laser may have a very short depth of field, so that the laser beam is in focus at the dielectric layer but is substantially defocused at the microelectronic element.

Figure 8:
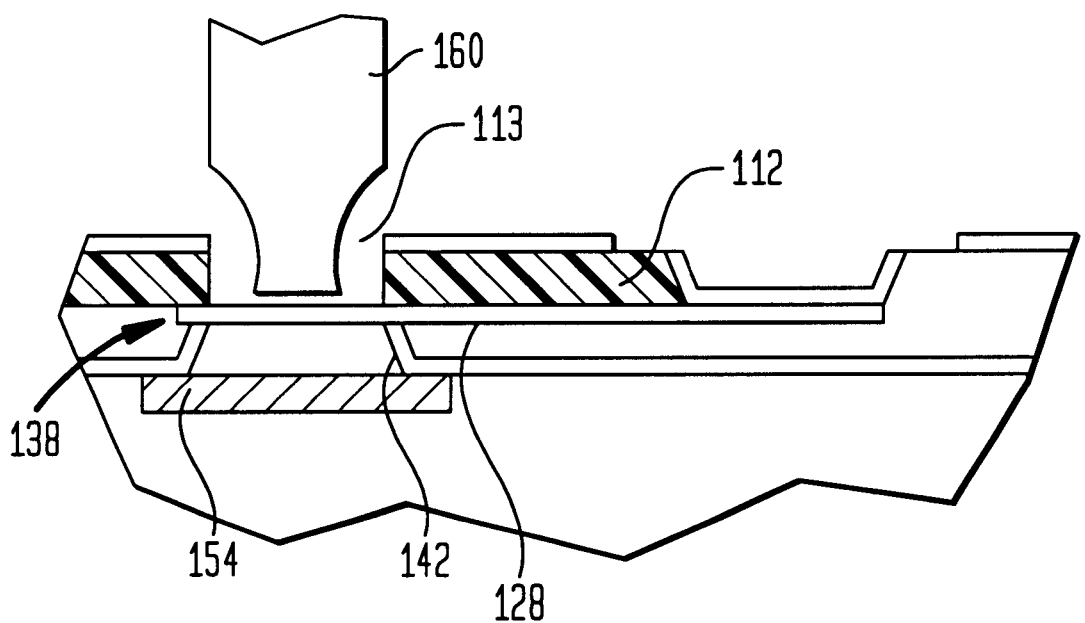
FIGS. 8 and 9 are fragmentary, diagrammatic sectional views of components in accordance with further embodiments of the invention.

In a further variant, the fixed end terminal structures 138 (FIG. 8) do not extend through the dielectric layer 112. Thus, the fixed end terminal structures include only a lower via liner 142, but no upper via liner. The metallic fixed end terminal structure thus terminates at the conductor 128. The dielectric layer 112 has a opening 113 aligned with the fixed end terminal structure so that the metallic material of the conductor 128 and fixed end terminal structure is exposed at the top surface of the dielectric layer through the opening 113. Here again, a tool 160 can be engaged directly with the metallic structure so that the metallic structure can be efficiently forced into engagement with the contact 154 of the first microelectronic element.

In the process discussed above with reference to FIGS. 1–7, the etchant degrades or removes the adhesive layer 36 only in regions aligned with lead regions 45 of the sheet and in neighboring areas. Thus, the adhesive layer remains in place between the main region 47 of the sheet and the dielectric layer, so that the adhesive layer secures the main region of the sheet to the first microelectronic element even after the etching process. In a variant of this process, the etching procedure can be replaced by another selective degradation step as, for example, local application of radiant energy to the lead regions and the underlying regions of the adhesive layer, so as to degrade the adhesive layer without destroying the lead regions. For example, the locally-applied radiant energy may heat the lead regions and the underlying regions of the adhesive layer. According to a further embodiment, the process used to degrade adhesive layer 36 may degrade or remove a larger portion of the adhesive layer, or the entire adhesive layer. Thus, the entire adhesive layer 36 may be removed by exposure to heat or an etchant. Even where the entire adhesive layer is removed, the main region 47 of the sheet will remain attached to the first microelectronic element 50 by the bonds between fixed end terminal structures 38 and contacts 54 of the first microelectronic element. In a further variant, adhesive layer 36 may be entirely omitted, so that the main region is secured to the first microelectronic element 50 by the bonds between the fixed end terminal structures and the contacts both before erosion of the dielectric layer 12 to form gaps 70, and remains secured after formation of the gaps.

Figure 9:
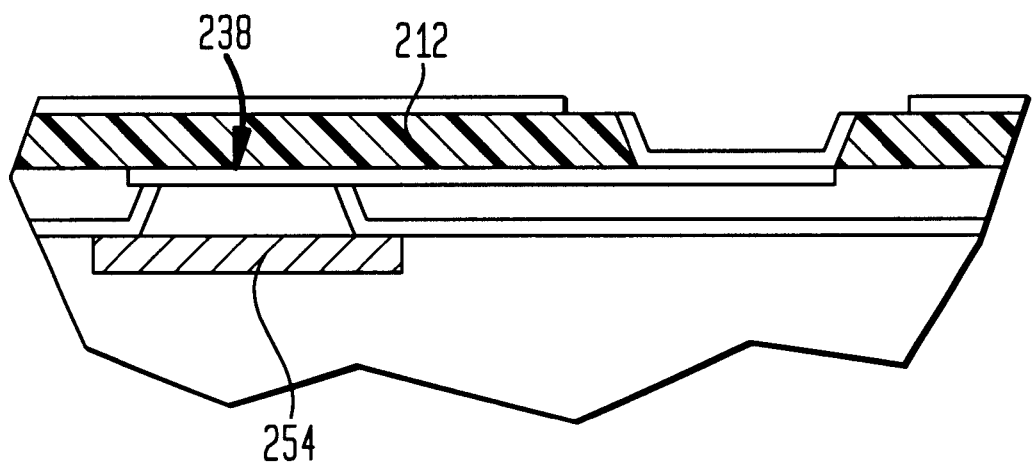

In a further variant (FIG. 9) the fixed end terminal structure 238 is not exposed at the top surface of the dielectric layer 112. Rather, the fixed end terminal structure is provided with a bonding material such as a solder or eutectic bonding alloy which can form a strong bond to the contact 154 without a high mechanical force, and the bonding process uses this bonding material. Heat and some pressure may be applied to the fixed end terminal structures 238 through the top dielectric layer 212.

Figure 10:
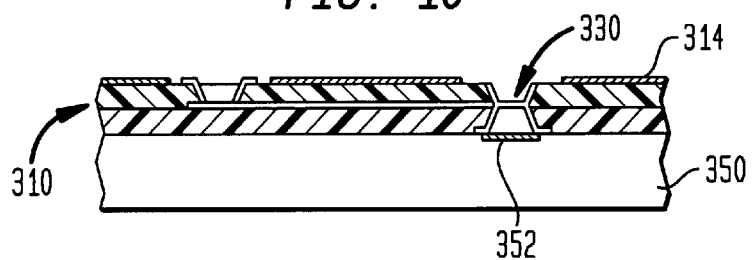
FIG. 10 is a fragmentary, diagrammatic sectional view of components in accordance with yet another embodiment of the invention.
Figure 11:
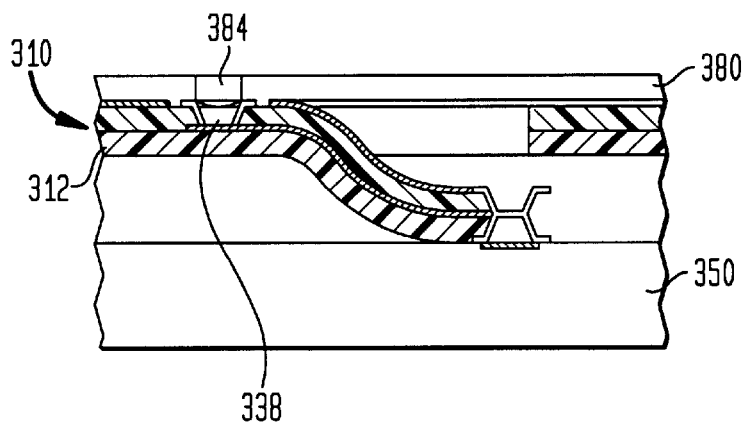
FIG. 11 is a view similar to FIG. 10 showing the components of FIG. 10 at a later stage in the process.

In a procedure according to a further embodiment (FIGS. 10–11) the tip end terminal structures 330 are exposed at the top surface of the sheet and then bonded to contacts 352 of the first microelectronic element 350. Here again, after bonding the tip end terminal structures 330, the openings in the dielectric layer are formed by eroding the dielectric layer using the top metallic covering 314 as a mask. The tip end terminal structures 330 may extend entirely through the sheet, so that the tip end terminal structures are exposed at the top surface of the sheet for transmission of forces as discussed above with reference to the fixed end terminal structures. The adhesive bond may be degraded between the entire sheet 310 and the entire front surface of the first microelectronic element 350. For example, the adhesive bond may be degraded by heat applied during the tip end terminal structure bonding procedure or by a separate heating operation. Alternatively or additionally, the adhesive bond may be degraded by application of radiant energy, as, for example, by applying radiant energy through the microelectronic element where the microelectronic element is transparent or translucent to such radiant energy. Before or after degrading the adhesive bond, the fixed end terminal structures 338 are bonded to conductive features 384 on the second microelectronic element 380. Thus, when the second microelectronic element is moved away from the first microelectronic element 350, the main portion of sheet 310 moves with the second microelectronic element. Because the fixed end terminal structures are not bonded to the first microelectronic element, they need not extend to the bottom of the sheet and hence need not extend to the bottom of adhesive layer 312.

Figure 12:
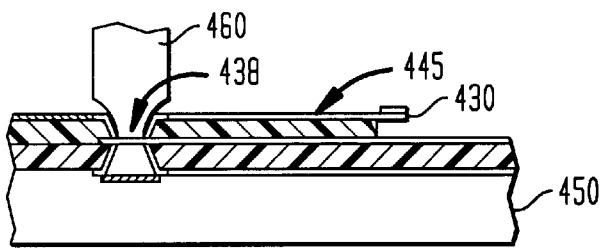
FIG. 12 is a fragmentary, diagrammatic sectional view showing components in accordance with yet another embodiment of the invention.
Figure 13:
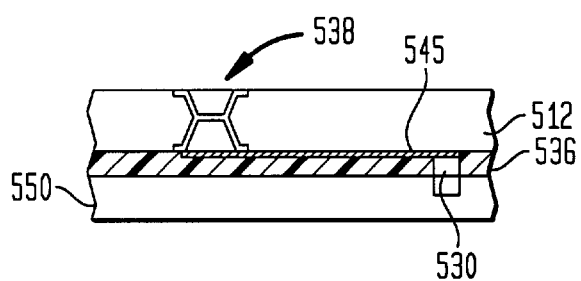
FIG. 13 is a view similar to FIG. 12 but depicting components according to a further embodiment of the invention.

Certain aspects of the invention can be practiced using a connection component wherein the lead-forming elements include discrete leads rather than portions of the sheet itself. For example, in the embodiment of FIG. 12, the sheet has separate metallic leads 445 overlying the top surface of the sheet, these leads having tip ends 430 releasably connected to the surface of the sheet. Here again, the fixed end terminal structures 438 are exposed at the top surface of the sheet for engagement of a bonding tool 460 so that the fixed end terminal structures can be effectively bonded to the contacts of the first microelectronic element 450. Following bonding, the tip end terminal structures 430 are bonded to a second microelectronic element (not shown) and the second microelectronic element is displaced upwardly away from the first microelectronic element so as to bend the metallic leads 445 away from the sheet. In a further variant (FIG. 13) metallic leads 545 are provided on the bottom surface of a dielectric layer 512. An adhesive layer 536 surrounds the leads but does not cover tip end terminal structures 530. Here again, the adhesive layer secures the sheet in place while the leads are bonded. After bonding, the adhesive bond is degraded and the dielectric layer 512 and the fixed ends 538 of the leads are moved away from the first microelectronic element 550.

Figure 14:
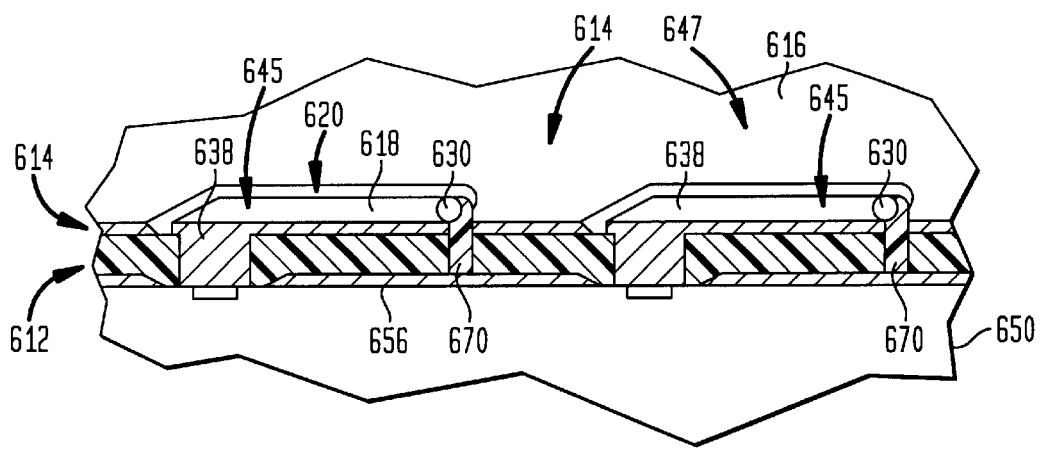
FIG. 14 is fragmentary, diagrammatic partially sectional perspective view depicting components according to still another embodiment of the invention.

In the processes discussed above, the sheet is provided as an element separate from the first microelectronic element, and assembled to the first microelectronic element. However, as shown in FIG. 14, the sheet may be formed in place on the first microelectronic element, as, for example, by depositing the protective layer 656; fixed end terminal structures 638; conductors 628; tip end terminal structures 630; dielectric layer 612 and metallic top covering layer 614 onto the first microelectronic element. In this embodiment, the metallic top covering layer 614 incorporates gaps 620 bounding strips 618. The strips 618 form the conductive elements of lead regions 645, and the strips are electrically connected to the fixed end terminal structures 638. Where the first microelectonic element 650 is a wafer, such deposition processes can be conducted using equipment commonly used to deposit features such as conductors and passivation layers on a wafer. One advantage of this approach is that the features of the sheet can be formed with excellent precision and in precise registration to other features of the wafer. The materials and processes used in this stage may be selected so that the fixed end terminal structures 638 are bonded to the contacts of the first microelectronic element, whereas the dielectric layer 612 is not bonded to the protective covering layer 656 and hence is not bonded to the first microelectronic element. The adhesive layer used in the embodiments discussed above may be omitted. Here again, the dielectric layer 612 is ablated or etched so as to form gaps 670 partially surrounding each lead region 645. Here again, the dielectric layer is left intact at the fixed ends of the lead regions, i.e., at and adjacent fixed end terminal structures 638, so that the fixed end terminal structures remain physically connected to the main region 647 of the sheet. After this step, and after bonding the tip end terminal structures to a second microelectronic element (not shown), the microelectronic elements are displaced away from one another so as to bend the lead regions to a vertically-extensive disposition.

In a variant of this procedure, the dielectric layer bonds to the adhesive layer. An etchant applied after formation of the gaps 670 in the dielectric layer etches the protective layer 656 away beneath the lead regions 645, with or without removal of the protective layer from beneath main region 647. In this procedure, the protective layer 656 serves the same functions as the adhesive layer 36 discussed above, and desirably also protects the microelectronic element during the erosion or ablation process employed to from gaps 670.

In further embodiments, conductors (not shown) separate from strips 618 may be provided on the bottom surface the dielectric layer in the lead region. For example, where the protective covering layer 656 is formed from aluminum, such bottom surface conductors may be formed from copper. An alkaline etch will remove the protective covering layer without substantially attacking the conductors. Other combinations of dissimilar materials may be employed in the same manner. The process discussed above can be modified so that the terminal end structures 630 are connected to the first microelectronic element, whereas the fixed end terminal structures are not bonded to the first microelectronic element. As in the embodiment discussed above with reference to FIGS. 10–11, the main portion of the sheet, and the fixed end terminal structures 638, move away from the first microelectronic element when the second microelectronic element is displaced away from the first microelectronic element.

Figure 15:
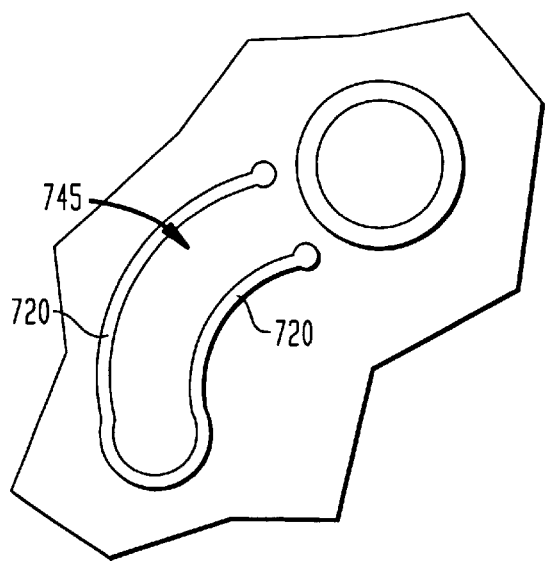
FIGS. 15 and 16 are fragmentary plan views depicting components according to still further embodiments of the invention.
Figure 16:
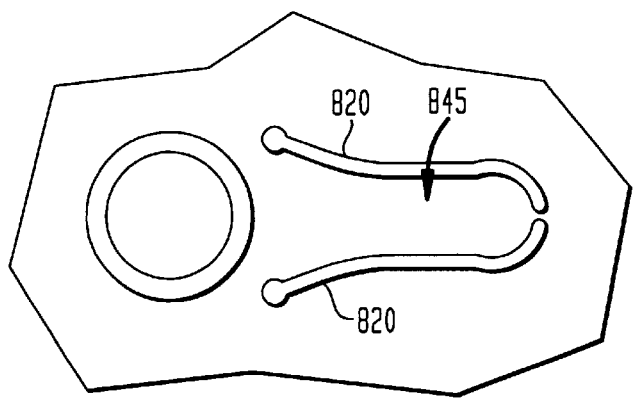

Leads of essentially any shape can be formed. Merely by way of example, the lead regions 745 (FIG. 15), and the gaps 720 bounding such lead regions, may be curved. As shown in FIG. 16, the gaps 820 may define tapered lead regions 845. The sheet may include additional layers. For example, additional metallic layers may be provided within the dielectric layer or on the bottom surface of the dielectric layer. Such additional metallic layers may extend over the main region of the sheet. Conductors 28 (FIG. 1) may be formed as part of a metallic layer on the bottom surface of the dielectric layer. Such a bottom-surface metallic layer (not shown) may have gaps aligned with the gaps 20 in the top-surface metallic layer. Thus, the bottom-surface metallic layer may include portions extending on the main region of the sheet. In a further variant, the top-surface metallic layer 14 (FIG. 1) may be omitted. In this embodiment, a temporary mask such as a photoresist may be used during formation of the gaps in the dielectric layer.

One or both of the microelectronic elements used in the processes discussed above can be replaced by a temporary element such as a sacrificial layer, tool or fixture. The terminal structures are bonded to such a temporary element or elements. The leads are deformed by moving the temporary element or elements in the same manner as discussed above, to provide vertically-extensive leads. After this step, and desirably after formation of a dielectric layer around the leads, the temporary element or elements can be removed, so as to leave the fixed end terminal structures, tip end terminal structures, or both, exposed for connection to other elements.

Subcombinations of the process steps discussed above can be employed within the scope of the present invention. Merely by way of example, a partial process which ends prior to deformation of the lead regions can be used to provide a semifinished element which can be subjected to further process steps at a later time.

As these and other variations and combinations of the features discussed above can be utilized, the foregoing description of the preferred embodiments should be take by way of illustration rather than by way of limitation of the invention as defined by the claims.

What is claimed is:

1. A method of making a microelectronic assembly comprising the steps of:
   (a) providing a sheet overlying a first element, said sheet having lead regions each having a tip end and a fixed end remote from its tip end, said sheet having a main region surrounding said tip regions, said lead regions of said sheet including conductive material extending between said tip ends and said fixed ends;
   (b) connecting the tip ends or the fixed ends of said lead regions to said first element; then
   (c) removing portions of said sheet adjacent said lead regions to leave a plurality of gaps in said sheet partially surrounding each said lead region so that the fixed end of each said lead region remains connected to said main region but said tip ends can be displaced relative to said main region.

2. A method as claimed in claim 1 wherein said connecting step includes connecting the tip ends of said lead regions to said first element, the method further comprising the step of moving said main region of said sheet and said first element away from one another through a predetermined displacement so as to bend said lead regions downwardly from said main region of said sheet and form leads projecting from said main region of said sheet.

3. A method as claimed in claim 1 wherein said connecting step includes connecting the fixed ends of said lead regions to said first element, the method further comprising the step of moving said tip ends of the leads and said first element away from one another through a predetermined displacement so as to bend said lead regions upwardly from said main region of said sheet and form leads projecting from said main region of said sheet.

4. A method as claimed in claim 1 wherein said step of providing said sheet includes at least partially forming said sheet in place on said first element.

5. A method as claimed in claim 1 wherein said step of providing said sheet includes providing a dielectric layer and a metallic layer so that said metallic layer is disposed above said dielectric layer and said dielectric layer is disposed between said metallic layer and said first element, said metallic layer covering regions of said sheet outside of said lead regions.

6. A method as claimed in claim 5 wherein said step of removing portions of said sheet includes eroding portions of said dielectric layer not covered by said metallic layer, said metallic layer protecting portions of said sheet during said eroding step.

7. A method as claimed in claim 6 wherein said lead regions include metallic strips disposed above said dielectric layer, and wherein said metallic strips also protect portions of said dielectric layer during said eroding step.

8. A method as claimed in claim 7 wherein said eroding step includes ablating said dielectric layer by directing radiant energy onto said sheet.

9. A method as claimed in claim 8 wherein said first element is a first microelectronic element, the method further comprising the step of providing a metallic protective covering between said first microelectronic element and said dielectric layer, said covering protecting said first microelectronic element from radiant energy penetrating through said dielectric layer during said ablating step.

10. A method as claimed in claim 7 wherein said eroding step includes exposing the surface of the sheet facing away from the first element to a chemical etchant.

11. A method as claimed in claim 7 wherein at least some of said metallic strips of said lead regions are continuous with said metallic layer.

12. A method as claimed in claim 7 wherein said dielectric layer includes an adhesive facing toward said first element and securing said sheet to said first element, said adhesive being at least partially removed or degraded during said eroding step.

13. A method as claimed in claim 1 wherein said first element is a first microelectronic element, said step of providing said sheet including providing the sheet separate from said first element, the sheet having a bottom surface, a top surface, and tip end terminal structures at the tip ends of the leads exposed at said bottom surface, and juxtaposing said sheet with the first microelectronic element so that the tip end terminal structures are aligned with the contacts of the first microelectronic element, said step of connecting including bonding said tip end terminal structures to said contacts of said microelectronic element.

14. A method as claimed in claim 13 wherein said sheet includes a dielectric layer and metallic force transmission elements extending through the dielectric sheet at said tip end terminal structures, and wherein said bonding step includes applying downward force to said force transmission elements to thereby forcibly engage said tip end terminal structures with said contacts of said microelectronic element.

15. A method as claimed in claim 14 wherein said bonding step includes thermosonic or ultrasonic bonding.

16. A method as claimed in claim 1 wherein said first element is a first microelectronic element.

17. A method as claimed in claim 16 wherein said first element is a wafer including a plurality of semiconductor chips.

18. A method as claimed in claim 17 wherein said step of providing said sheet includes at least partially forming said sheet on a surface of said first element.

19. A method of making a microelectronic assembly comprising the steps of:
   (a) providing a sheet with lead regions each having a tip end and a fixed end remote from its tip end, said sheet having a main region surrounding said lead regions, said sheet having a plurality of gaps partially surrounding said lead regions so that the fixed end of each said lead region is attached to said main region, said leads regions including conductive material extending between said tip ends and said fixed ends;
   (b) adhesively securing the sheet on a surface of a first element and connecting the fixed ends or the tip ends of said lead-forming elements to said first element; and
   (c) providing interruptions in the adhesive bond between the sheet and the first element at said lead-forming regions so as to at least partially free at least said lead-forming regions for movement relative to the first element.

20. A method as claimed in claim 19 wherein said step of providing interruptions includes degrading the adhesive bond between the lead regions and the first element.

21. A method as claimed in claim 19 wherein said step of providing said sheet includes forming said gaps after adhesively securing the sheet to the first element.

22. A method as claimed in claim 19 wherein said step of forming said gaps includes exposing the sheet to an etchant so that the etchant erodes a dielectric layer in the sheet, and wherein said etchant penetrates to the adhesive bond through the gaps, said step of degrading the adhesive bond being performed at least in part by said etchant.

23. A method as claimed in claim 19 wherein said etchant penetrates to the adhesive bond through the gaps, said step of degrading the adhesive bond being performed at least in part by said etchant.

24. A method as claimed in claim 19 wherein said step of providing interruptions in the adhesive bond includes selectively forming said adhesive bond.

25. A method as claimed in claim 24 wherein said selective forming step includes providing a layer of an adhesive having openings aligned with said lead regions.

26. A method as claimed in claim 25 wherein said step of providing said sheet includes providing said sheet separately from said first element with said layer of adhesive thereon and laminating the sheet to the first element using said adhesive.

27. A method as claimed in claim 19 further comprising the step of moving the tip ends of the leads away from the first element.

28. A method as claimed in claim 27 further comprising the step of bonding said tip ends to a second element, said step of moving the tip ends being performed by moving said second element away from the first element.

29. A method as claimed in claim 28 further comprising the step of injecting a flowable material between said first and second elements after said moving step so as to surround said lead regions.

30. A method as claimed in claim 19 wherein said step of providing interruptions in said adhesive bond is performed so as to leave some adhesive bond between the main region of the sheet and the first element.

31. A connection component for use in fabrication of microelectronic assemblies comprising:
 (a) a polymeric dielectric sheet having top and bottom surfaces, said sheet having lead regions each having a tip end and a fixed end;
 (b) metallic conductive material carried on said sheet, said metallic material including metallic conductors extending within said lead regions between said fixed ends and said tip ends, said metallic material including a metallic covering on a surface of said dielectric sheet, said covering overlying said lead regions and overlying at least a part of said main region, said covering having gaps therein partially surrounding said lead regions; and
 (c) metallic terminal structures adjacent said fixed ends of said lead regions electrically connected to said conductors, said terminal structures including bonding terminals exposed at said bottom surface of said dielectric layer, said metallic terminal structures extending through said dielectric sheet.

32. A component as claimed in claim 31 wherein said metallic covering is provided on said top surface of said dielectric sheet.

33. A component as claimed in claim 32 wherein at least some of said conductors are provided remote from said top surface of said dielectric sheet and wherein said metallic covering includes metallic strips overlying said lead regions on said top surface of said dielectric layer.

34. A method of making a microelectronic assembly comprising the steps of:
 (a) juxtaposing a dielectric sheet having a main portion with top and bottom surfaces and having metallic terminal structures extending through the sheet so such metallic terminal structures have a top ends exposed at said top surface of said sheet and bottom ends exposed at said bottom surface of said sheet with a first microelectronic element so that the bottom ends of the terminal structures are aligned with contacts on the first microelectronic element;
 (b) bonding the bottom ends of the terminal structures to contacts on the first microelectronic element, said bonding including applying downward forces to the top ends of said terminal structures so as to forcibly engage such bottom ends with said contacts; then
 (c) deforming lead-forming elements of the sheet electrically connected to said terminal structures so as to bend tip ends of such lead forming elements away from said first microelectronic element and away from said main portion of said sheet.

35. A method as claimed in claim 34 further comprising adhesively bonding the main portion of the sheet to said first microelectronic element.

36. A method as claimed in claim 35 wherein said adhesive bonding step is performed prior to said step of bonding the terminal structures.

37. A method as claimed in claim 34 wherein said lead-forming elements include lead regions of said sheet.

38. A method as claimed in claim 34 wherein said lead-forming elements include leads overlying the top surface of said sheet.

39. A method as claimed in claim 34 wherein said step of bonding said terminal structures to said contacts includes ultrasonic or thermosonic bonding.

* * * * *

UNITED STATES PATENT AND TRADEMARK OFFICE
CERTIFICATE OF CORRECTION

PATENT NO. : 6,572,781 B2
DATED : June 3, 2003
INVENTOR(S) : Belgacem Haba

It is certified that error appears in the above-identified patent and that said Letters Patent is hereby corrected as shown below:

Title page,
Item [57], ABSTRACT,
Line 9, "region, is lifted away" should read -- region, are lifted away --.

Column 1,
Line 17, "elements such" should read -- element such --.

Column 3,
Lines 54-55, "erosion processes" should read -- erosion process --.

Column 5,
Line 34, "adhesive such a" should read -- adhesive such as a --.

Column 14,
Line 45, "region, said leads" should read -- region, said lead --.

Column 16,
Line 16, "structures have a top ends" should read -- structures have top ends --.

Signed and Sealed this

Sixteenth Day of September, 2003

JAMES E. ROGAN
*Director of the United States Patent and Trademark Office*